United States Patent [19]
Williamson

[11] Patent Number: 5,317,256
[45] Date of Patent: May 31, 1994

[54] HIGH-SPEED, HIGH-IMPEDANCE EXTERNAL PHOTOCONDUCTIVE-TYPE SAMPLING PROBE/PULSER

[75] Inventor: Steven L. Williamson, Ann Arbor, Mich.

[73] Assignee: University of Michigan, Ann Arbor, Mich.

[21] Appl. No.: 882,053

[22] Filed: May 12, 1992

[51] Int. Cl.$^5$ .............................................. G01R 1/073
[52] U.S. Cl. ................................. 324/158 P; 324/72.5
[58] Field of Search ............... 324/158 P, 158 D, 72.5, 324/96, 73.1, 158 F; 257/48

[56] References Cited

U.S. PATENT DOCUMENTS

| | | | |
|---|---|---|---|
| 3,801,910 | 4/1974 | Quinn | 324/158 D |
| 3,956,698 | 5/1976 | Malmberg et al. | 324/158 D |
| 4,851,767 | 7/1989 | Halbout et al. | 324/158 D |
| 4,916,002 | 4/1990 | Carver | 257/48 |
| 5,177,437 | 1/1993 | Henley | 324/73.1 |

OTHER PUBLICATIONS

Atomic Emission From Gold Scanning-Tunneling-Microscope Tip ||, by Mamin, et al., Phys. Rev. Ltrs., vol. 65, No. 19, Nov. 5, 1990.

Picosecond GaAs-Based Photoconductive Optoelectronic Conductors by Smith, et al., Proc. of Picosec. Elec. . . ., vol. 24, 1989, 176–183.

Capacitance Free Generation and Detection of Sub-picosecond . . ., Grischowsky, et al. IEEE J. Quant. Elec., vol. 24, No. 2, Feb. 1988.

"Picosecond Photoconductors: Physical Properties and Applications", by D. H. Auston, as Chapter 4 of *Picosecond Optoelectronic Devices*, 1984, pp. 73–117.

"Physical Properties of Thin-Film Field Emission Cathodes with Molybdenum Cones", by C. A. Spindt, et al., *J. Appl. Phys.*, vol. 47, No. 12, Dec. 1976.

*Primary Examiner*—Ernest F. Karlsen
*Attorney, Agent, or Firm*—Rohm & Monsanto

[57] ABSTRACT

A photoresponsive pulser/sampler system for investigating electrical signals and responses in VLSI systems employs a microtip which communicates electrically and mechanically with the device under test, and electrically with an electrode via a photoresponsive gate. The photoresponsive gate is formed of interdigitated electrodes which have interdigital spacings therebetween on the order of 1 $\mu$m. The structure of the invention is operable in the dual modalities of probe and pulser which share a common probe tip. Simultaneous implementation of the pulser and sampler functions is achieved with the use of a lock-in amplifier and the technique of difference frequency mixing, where the pulser optical pulse frequency is $f_1$ and the gate optical pulse frequency is $f_2$. Multiple photoresponsive gates coupled to a common probe tip and having respective electrodes are disclosed for achieving respective pulsing and sampling functions, and also for effecting S-parameter measurements. The lock-in amplifier is tuned to the difference between the two frequencies ($f_2-f_1$). Piezoelectric apparatus is employed for translating the probe tip over the device under test.

31 Claims, 5 Drawing Sheets

HIGH-SPEED, HIGH-IMPEDANCE EXTERNAL PHOTOCONDUCTIVE-TYPE SAMPLING PROBE/PULSER

GOVERNMENT RIGHTS

This invention was made with government support under Contract Number 027392 awarded by the Air Force-RADC and Contract Number 026506 awarded by the Army Research Office. The government has certain rights in the invention.

RELATIONSHIP TO OTHER APPLICATIONS

This invention is related to an Application for United States Letters Patent filed on May 12, 1992, the same date as the filing of the present application in the United States Patent and Trademark Office, in the names of co-inventors Yi Chen and Steven Lee Williamson, Steven Lee Williamson also being the sole inventor herein, entitled Photoresponsive Interdigitated Metal-Semiconductor-Metal Structure, Ser. No. 07/882,055, filed May 12, 1992, the disclosure of which is incorporated herein by reference. Both patent applications are assigned to the same assignee.

BACKGROUND OF THE INVENTION

This invention relates generally to systems for measuring electrical signals form electronic or optoelectronic devices and systems, and more particularly, to an electrode structure having a contact electrode for receiving the signals to be measured, and interdigitated electrode structure forming a metal-semiconductor-metal photoconductive gate, and an output electrode.

There is a need for an arrangement which can communicate directly with one or more portions of a circuit to be tested, such as an integrated circuit, and particularly for facilitating internal node testing within very large scale integration (VLSI) systems. Such node testing requires compliance with increasingly challenging specifications, since VLSI systems are increasing in circuit component density, and soon will have electrode dimensions nearing 0.1 μm. Additionally, such VLSI systems will soon be operating a very high speeds, on the order of 50 ps and below. Known measurement systems fall short, by at least an order of magnitude of reaching both of these benchmarks simultaneously.

In addition to achieving communication with specific nodes within a VLSI system, and achieving the high gate speeds necessary to achieve meaningful measurements, it is essential that the measuring system be non-disturbing, in several senses. First, the measurement system should have a high electrical impedance so as not to produce loading of the integrated circuit components. Such electrical loading not only disturbs the circuit under test whereby the results obtained are representative of the operation of the circuit, but also present a danger to the circuit under test since such high density systems operate at extremely small currents. In addition, it is crucial that the measurement system not disturb the integrated circuit mechanically. It is well known that the internal mechanical structures of integrated circuits, particularly VLSI systems are extremely small and fragile.

A system for measuring signals in integrated circuitry should, in addition to the foregoing, produce absolute voltage measurements, including DC-offsets. In this manner, a true representation of the electrical activity within the integrated circuit is achieved. Such measurements should additionally be free of cross-talk from adjacent electrode structures.

With respect to temperature, there is a need for a system which can function at ambient temperatures and pressures which are elevated and fluctuating. Oftentimes, elevation in temperature is produced by the circuit under test, and therefore, it is imperative that the measurements system not itself be responsive to such temperatures.

Prior art arrangements have been unable to achieve a sufficient sensitivity. Such sensitivity preferably should be on the order of 1 $\mu V/\sqrt{Hz}$ at a 1 MHz repetition rate. In addition, the measurement system should be translatable over a field of view of the circuit under test of at least 500 μm by 500 μm.

Currently available measurement systems are not capable of probing bonded pads and through-holes in passivation layers. Neither is there available in the state of the art a system capable of probing intermediate circuit layers of multilayer circuits.

It is, therefore, an object of this invention to provide temporal resolution of less than 50 ps, and preferably on the order of 1 ps.

It is another object of this invention to provide a measurement system which achieves a spatial resolution of 0.1 μM with repeat positionability.

It is also an object of this invention to provide an arrangement capable of measuring signals in VLSI circuits which does not disturb the circuit electrically.

It is a further object of this invention to provide a system for measuring signals in integrated circuits which does not disturb the circuit under test mechanically.

It is additionally an object of this invention to provide a system for measuring signals in integrated circuits which is immune to cross-talk from adjacent electrode structures.

It is yet a further object of this invention to provide a system which provides repeatable measurements of signals in VLSI circuits and which is immune to variations in ambient temperature and pressure.

It is also another object of this invention to provide a signal measurement system which achieves sensitivity on the order of 1 $\mu V/\sqrt{Hz}$ at 1 MHz repetition rate.

It is yet an additional object of this invention to provide an integrated circuit measurement and testing arrangement which can test over a field of view of at least 500 μm by 500 μm.

It is still another object of this invention to provide a system for measuring signals in integrated circuits which is capable of probing bonded pads and through-holes in passivation layers.

It is a yet further object of this invention to provide an integrated circuit measurement system which is capable of probing intermediate circuit layers.

It is also a further object of this invention to provide a system for measuring signals in integrated circuits which is capable of multiple, synchronous measurements.

It is additionally another object of this invention to provide an arrangement for producing controlled translation of a probe over a VLSI system for communicating with predetermined portions of the VLSI system.

A still further object of this invention is to provide a system which achieves pulser and sampler functions using a single probe tip.

An additional object of this invention is to provide a system which achieves sampling at frequencies greater than 100 MHz.

Yet another object of this invention is to provide a system which achieves pulsing at frequencies greater than 100 MHz.

SUMMARY OF THE INVENTION

The foregoing and other objects are achieved by this invention which provides a probe for achieving high-impedance electrical communication with a device under test which is to be subjected to measurement of high-speed electrical signals. The inventive probe is provided with a contact electrode for communicating electrically with the device under test. An input/output electrode is provided for selectably receiving and producing the high-speed electrical signals from the device under test. A photoconductive gate is coupled between the input/output electrode and the contact electrode for controlling electrical communication therebetween. The photoconductive gate is responsive to an optical signal and is formed as a metal-semiconductor-metal arrangement of interdigitated electrodes on a gate layer of a high-resistivity semiconductor material. The semiconductor material has a carrier lifetime of less than 10 ps and a bandgap sufficiently narrow to effect absorption of an optical gate pulse having a duration of less than approximately 10 ps, thereby resulting in photoconductivity.

In a specific illustrative embodiment of the invention, the contact electrode is dimensioned to have a height less than approximately 0.1 mm. Preferably, the contact electrode is formed integrally with the photoconductive gate and is arranged to be movable with respect to the device under test so as to facilitate electrical communication with selectable portions thereof.

The contact electrode is provided with a probe tip formed of an electrically conductive material and arranged to protrude so as to facilitate making the electrical communication with the device under test. In one embodiment, the probe tip is configured to have a substantially conical shape, having a height of approximately 3.5 $\mu$m and a tip radius of less than approximately 1 $\mu$m.

The photoconductive gate, as noted, is formed of interdigitated electrodes, such electrodes having spacing and widths on the order of 1 $\mu$m. In one embodiment, the photoconductive gate is arranged on a transparent layer formed of a semiconductor material for receiving an optical signal. The transparent layer has a band-gap characteristic sufficiently wide to be transparent to the optical signal. The gate layer is arranged intermediate of probe tip means and the transparent layer, the gate layer being formed of a semiconductor material which is characterized by high electron mobility and having a thickness of approximately between 0.5 and 1.5 $\mu$m. The gate layer has a band-gap characteristic sufficiently narrow to effect absorption of the optical signal and produce photoconductivity. The transparent layer is formed, in certain embodiments, of AlGaAs, and preferably low temperature-grown GaAs (Lt GaAs).

The transparent layer may be formed of InP or GaAs, with the gate layer formed of LT GaAs. In other embodiments, the transparent layer is formed of sapphire and the gate layer is formed of ion-implanted Si. Alternatively, the transparent layer is formed of glass, sapphire, or other transparent material and the gate layer is formed of polycrystalline-form GaAs, InGaAs, Si, or Ge. Still further, the transparent layer may be formed of AlGaAs.

The structure of the probe arrangement may be strengthened by depositing a transparent strengthening layer. This layer may be formed of $Al_2O_3$.

Shielding of the input/output electrode is effected with a shielding system which reduces electrical interference. Such a shielding system may include an undercoating layer arranged on one side of the input/output electrode, an overcoating layer arranged on the other side of the input/output electrode, and a metal layer arranged on the overcoating layer for forming the electrical shield. In some embodiments of the invention, the undercoating and overcoating layers are formed of $Al_2O_3$.

In some embodiments of the invention, the input/output electrode may be the center conductor of a coaxial cable. In addition, there may be provided an integrated low-pass filter which couples the contact electrode to a reference electrode. The input/output electrode may further have coupled thereto a capacitor for storing an electric charge. The capacitor is formed integrally with the input/output electrode, and there is further provided, in certain embodiments, a band-pass filter which is coupled to the input/output electrode.

In accordance with a further aspect of the invention, a probe system is provided for achieving high frequency electrical communication with a device under test. The probe system includes a probe tip for contacting electrically the device under test, the probe tip having a radius of less than 1 $\mu$m. A terminal is provided for communicating electrically with the probe tip, and a photoresponsive gate which is formed of submicron gate elements is interposed between the probe tip and the terminal for controlling conduction therebetween in response to an optical signal.

The probe tip, which is dimensioned to have a height of approximately 3.5 $\mu$m is formed of a deposited metal.

In accordance with a pulser/sampler probe system aspect of the invention, an electrical pulse having high frequency energy content is delivered to a device under test, and electrical energy is obtained from the device under test. The system is provided with a probe tip which contacts electrically the device under test, the probe tip having a submicron tip radius. A probe tip electrode means is arranged to communicate electrically with the probe time. An input electrode means receives and input electrical signal, and an input photoresponsive gate formed of submicron gate elements and interposed between the probe tip and the input electrode controls electrical conduction therebetween in response to a first optical signal. An output electrode is provided for receiving an output electrical signal from the probe tip.

In one embodiment, the pulser/sampler probe system is provided with an output photoresponsive gate formed of submicron elements and interposed between the probe tip electrode and the output electrode, for controlling electrical conduction therebetween. The first optical signal is characterized by a frequency $f_1$ and the second optical signal is characterized by a second frequency $f_2$. A lock-in amplifier is provided and is arranged to be responsive to the difference between the first and second frequencies ($f_2-f_1$). A capacitor is provided to the input electrode for storing a charge to be switched by the input photoresponsive gate. Additionally, a termination electrode may, in certain embodiments, be coupled to the probe tip electrode for providing a predetermined impedance at the probe tip.

BRIEF DESCRIPTION OF THE DRAWING

Comprehension of the invention is facilitated by reading the following detailed description, in conjunction with the annexed drawing, in which.

DETAILED DESCRIPTION

The present invention is predicated in part of the recognition that, contrary to the traditional view, the response time of a photoconductive-type detector is enhanced as the electrode spacing is reduced. This improvement amounts to a few picoseconds in the detector response and is not easily observed except when using a fast-recovering semiconductor, such as LT-GaAs. In addition to requiring a fast material, a subpicosecond measurement technique is necessary to observe the change in the response time.

To operate the photoconductive-type detector at its highest sensitivity requires a bias voltage close to the dc breakdown. At sufficiently high field, the responsivity can approach that of a conventional photodiode. For the present detector, the intrinsic carrier lifetime for the semiconductor was determined to be 0.5–1.0 ps using an all-optical reflectivity measurement technique. Then, the following design formula was applied:

$$I_p = q\left(n\frac{P_{opt}}{h\nu}\right)\left(\frac{\mu_n \tau E}{L}\right) \text{where,} \quad \text{Eq. 1}$$

$$\left(\frac{\mu_n \tau E}{L}\right) = \frac{\text{carrier-lifetime}}{\text{carrier-transit-time}}$$

where:

| | | | | |
|---|---|---|---|---|
| $I_p$ | = Photo-induced current | $h\nu$ | = | Photon energy |
| q | = Charge of electron | $\mu_n$ | = | Electron mobility |
| n | = Quantum efficiency | $\tau$ | = | Carrier lifetime |
| $P_{opt}$ | = Incident optical power | E | = | Electric field |
| | | L | = | Electrode spacing | which states that by matching the carrier transit time to the previously measured carrier lifetime, the sensitivity of a photoconductive-type detector can reach that of an ideal photodiode. A carrier transit time of 1 ps would require an electrode spacing on the order of 100 nm for this condition to be satisfied.

With an electrode spacing > 500 nm, a regime of non-steady-state charge transport is achieved. In that case, the electron velocity, $\mu_n$, for the case of GaAs is not the conventional steady-state saturation value of $\sim 10^7$ cm/s, but instead can be as high as $2$–$3 \times 10^7$ cm/s. This means that an electrode spacing of 200 nm should be sufficient to achieve photodiode-like sensitivity (responsivity $\sim 0.5$ A/W).

At an electrode spacing of 200 nm, a bias voltage of 10 V dc has been applied without breakdown. This corresponds to 500 kV/cm, and is the highest electric field yet applied across a semiconductor-based metal-semiconductor-metal (MSM) structure. At this field strength, a responsivity of 0.1 A/W has been measured experimentally, without accounting for losses resulting from optical reflections at the surface. Using electro-optic sampling technique, the decay time for the detector was fast at all bias voltage settings, even at the highest. This was a surprising result.

The same material with 1000 nm electrode spacing showed an increase in decay time as the E-field was increased from 50 to 200 kV/cm. Although it would appear that higher sensitivity could be obtained from the larger, 1000 nm-electrode-spaced detector, the would also be an accompanying loss in detector response. From Eq. 1 one can determine that in order to achieve unity photocurrent gain, for a carrier lifetime $\tau = 1$ ps, and a mobility $\mu_n = 100$ cm$^2$/Vs, requires a value for $E/L = 10^{10}$ V/cm$^2$. For electrode spacing of $L \sim 1000$ nm ($10^{-6}$ cm) the required E-field is $\sim 10^6$ V/cm. At this electrode spacing, broadening of the response time was observed when the E-field was above $10^5$ V/cm. However, with the electrode spacing reduced to $\sim 200$ nm, the required E-field to achieve unity photocurrent gain is $\sim 2 \times 10^5$ V/cm. At this electrode spacing, no degradation to the response was observed even for E-fields as high as $5 \times 10^5$ V/cm. Therefore, reducing the electrode spacing to 200 nm simultaneously achieves near-unity photocurrent gain and holds the response time to 1.2 ps.

Figures 1A, 1B:
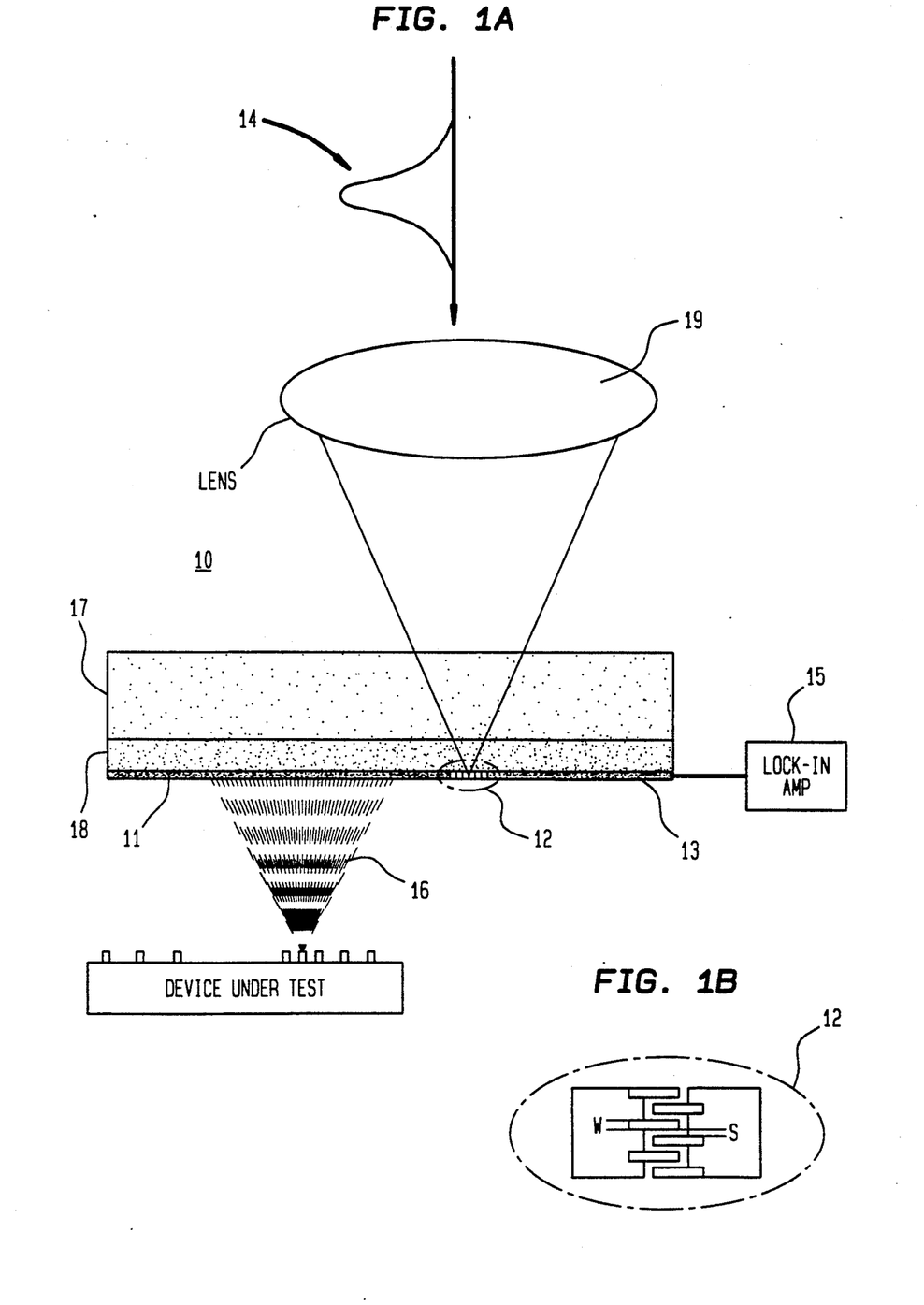
FIG. 1a is a side view of a probe system constructed in accordance with the principles of the invention shown in communication with a device under test.
FIG. 1b is a schematic representation of an interdigitated electrode structure.

FIG. 1 is a side view of a photoresponsive probe system 10 constructed in accordance with the invention. As shown in this figure, probe system 10 is provided with an interdigitated photoresponsive gate 12 which is shown in greater detail in the insert to FIG. 1. The photoresponsive gate arrangement is described in detail in the related patent application, filed on even date herewith, and identified hereinabove.

Photoresponsive gate 12 is interposed between an electrode 11 on which is deposited a probe tip 16, and an electrode 13 which, in this embodiment, is coupled electrically to a lock-in amplifier (not shown). Electrodes 11 and 13, as well as photoresponsive gate 12, are arranged on a layer of semiconductor material 18 which is active in that it has a band-gap characteristic which induces the generation of photocarriers in response to incident light, such as light pulse 14 which is delivered to the underside of photoresponsive gate 12 via a lens 19. The light of light pulse 14 is propagated through transparent layer 17 of semiconductor material. This light pulse therefore controls the on-and-off state of photoresponsive gate 12, and therefore, the electrical communication between electrode 13 and probe tip 16.

In addition to serving as a high-sensitivity photodetector, the inventive device can also be used as a high-efficiency switch for electrical pulse generation or gating operation. Experimental measurements show that, with a modest amount of light, i.e., tens of pJ, the photoresponsive gate of the present invention can be driven from $10^7 \Omega$ down to about 10 $\Omega$, with only slight broadening of the response, i.e., from 1.2 to 1.5 ps. Therefore, the same switch can function in dual mode as either a sensitive photodetector with a responsivity of 0.1 A/W, or at a higher light level, as an efficient pulse generator or gate. In pulse generation mode, peak electrical signals of 13 V have been generated into 90 $\Omega$ using 21 pJ/pulse, corresponding to an optical-to-electrical power conversion of >10%.

Figure 2:
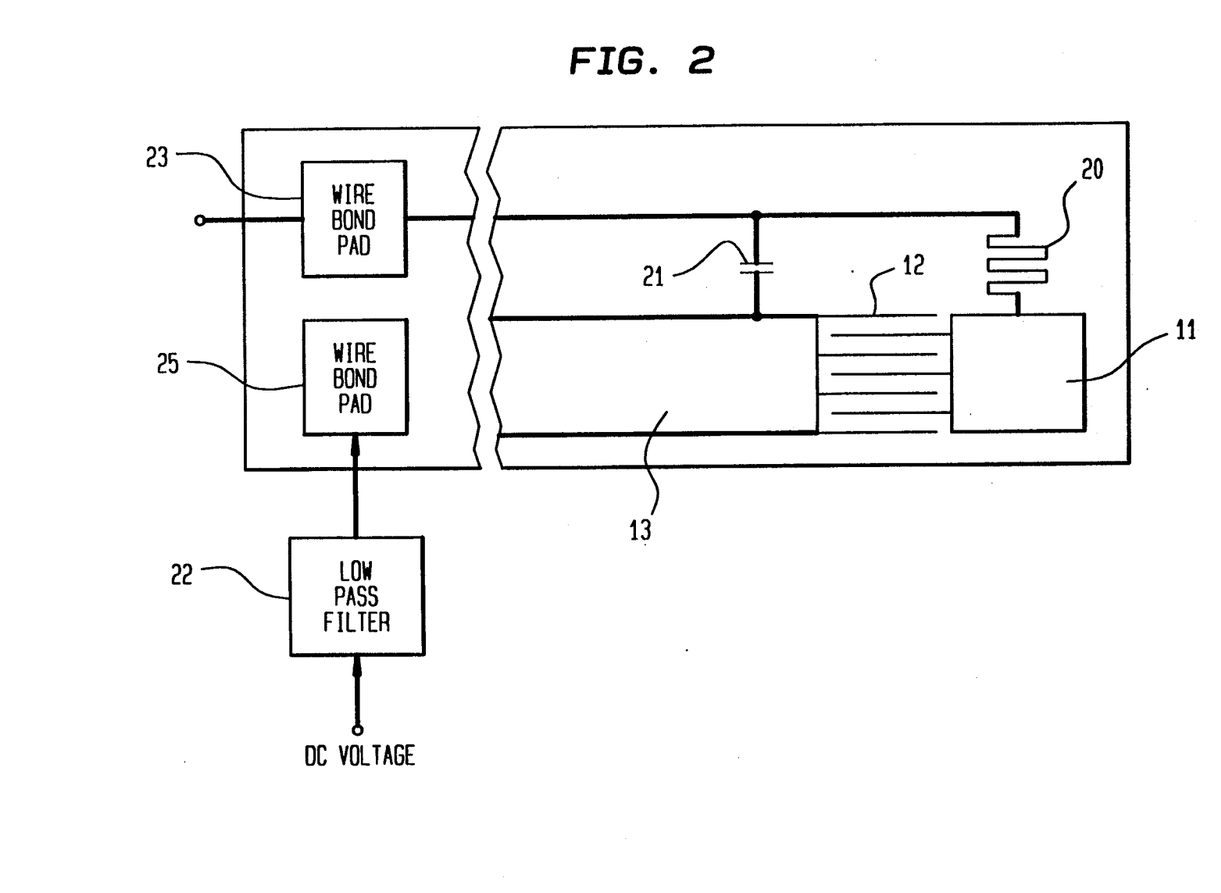
FIG. 2 is a schematic representation of a pulser system constructed in accordance with the principles of the invention and showing the interrelationship between the interdigitated electrode structure, an integrated low-pass filter, and an integrated capacitor.

FIG. 2 is a schematic representation of a pulser system constructed in accordance with the principles of the invention and showing the interrelationship between the interdigitated electrode structure, an integrated low-pass filter, and an integrated capacitor. Elements of structure which bear analogous correspondence to those discussed hereinabove with respect to FIG. 1, are similarly designated. This figure shows a reference electrode in the form of a wire bond pad 23 which is coupled electrically to bias electrode 13 via a storage capacitor 21. Electrode 11, on which the probe tip (not shown) is arranged, is also coupled to wire bond pad 23 via a low-pass filter 20. Low-pass filter 20 is integrally formed with the interdigitated photoresponsive gate 12. Capacitor 21 also is integrally formed and has a value less than 10 pF. This capacitor supplies a charge to the photoconductive gate which is coupled as a pulse to electrode 11 and the probe tip via the photoresponsive gate. Such coupling is responsive to the receipt of incident light as discussed hereinabove with respect to FIG. 1.

A low-pass filter 22 receives a DC voltage which is conducted to a further wire bond pad 25. Wire bond pad 25 is electrically coupled to electrode 13, which in this embodiment of the invention, functions as a bias electrode. In a practical embodiment of the invention, a prototype interdigitated structure having 0.2 $\mu$m interdigital spacing has been fabricated which has been shown to hold off a bias of some 10 V dc. This corresponds to 500 KV/cm, and is the highest electric field yet applied across a semiconductor-based metal-semiconductor-metal (MSM) structure.

Figure 3:
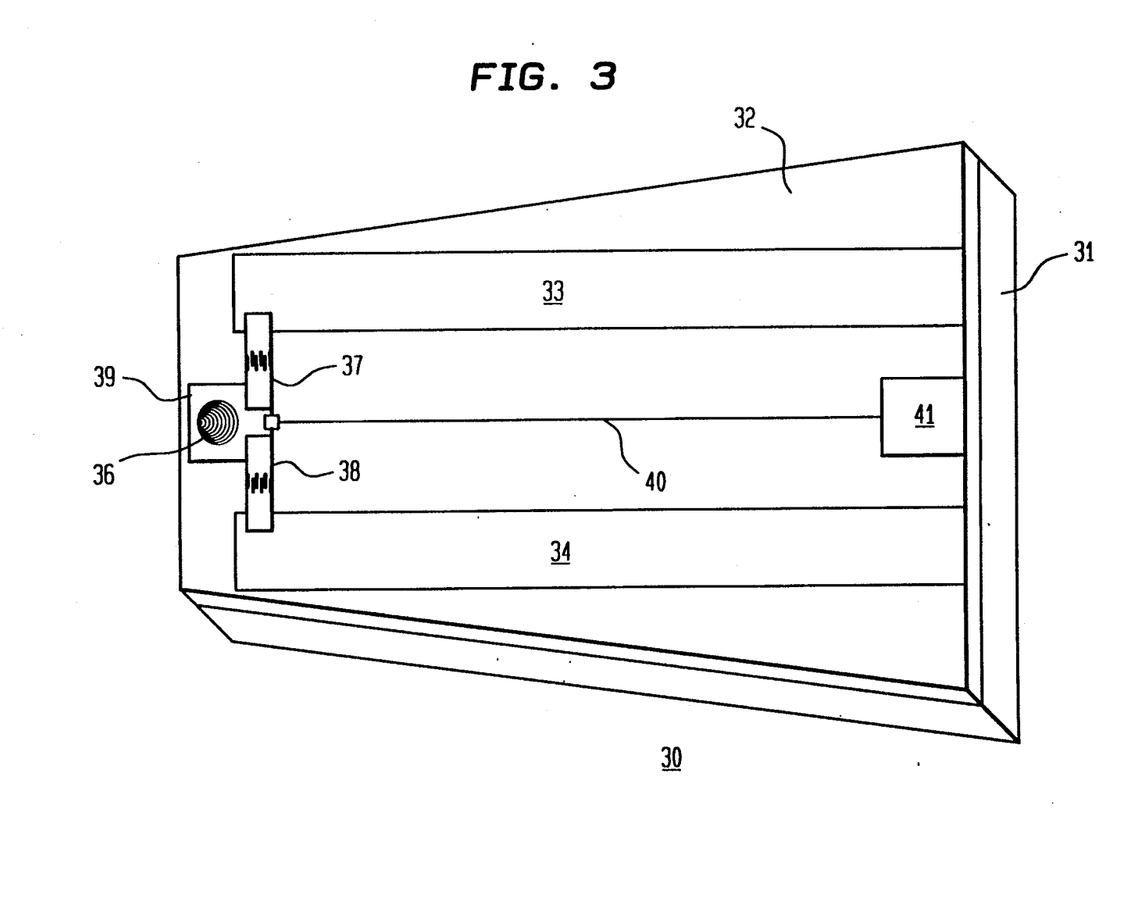
FIG. 3 is a representation of the underside of a GaAs-based picosecond pulser/sampler probe constructed in accordance with the invention.

FIG. 3 is a representation of the underside of a specific illustrative embodiment of the invention which comprises a GaAs-based picosecond pulser/sampler probe 30. Probe 30 is formed on a transparent substrate 31 on which is deposited a photoresponsive layer 32 which is capable of generating photo-induced carriers.

Electrodes 33 and 34 are coupled to probe tip 36 via respective ones of photoresponsive gates 37 and 38. The photoresponsive gates are each coupled to a contact electrode 39 on which the probe tip is arranged.

In addition to the foregoing, a conductor couples contact electrode 39 to a bonding pad 41. This arrangement of pad 41 and conductor 40 can be used to provide a DC termination resistance which facilitates determination of a system impedance.

In operation, electrode 33 may function as an input electrode which provides pulses to probe tip 36 for delivery to the device under test (not shown). In such an arrangement, photoresponsive gate 37 may be provided with a storage capacitor, as discussed hereinabove with respect to FIG. 2. Photoresponsive gate 38 may function as a sampling switch which couples to electrode 34 which serves as the output electrode. This electrode may be attached to a low impedance lock-in amplifier (not shown in this figure).

In a further possible mode of operation of the structure of FIG. 3, electrode 33 may function as an input or bias electrode which communicates electrically via photoresponsive gate 37. This photoresponsive gate is modulated optically at a frequency $f_2$. Electrode 34 serves as an output electrode, and its associated photoresponsive gate is modulated as a sampling switch at a frequency $f_1$. The lock-in amplifier (not shown in this figure) would then be tuned to a frequency of $f_2 - f_1$.

Figure 4:
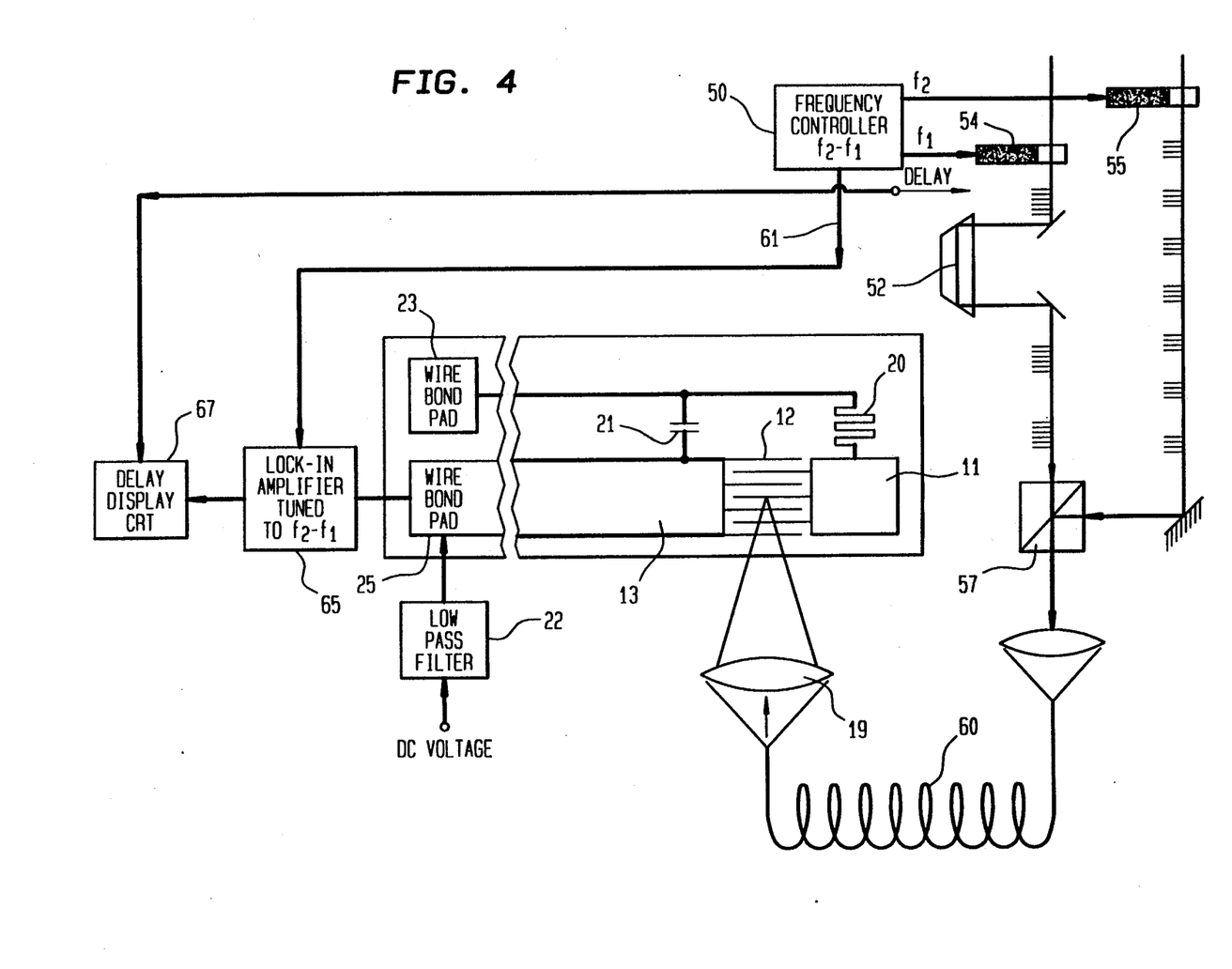
FIG. 4 is a schematic representation of the embodiment of FIG. 2 further showing combined optical signals being delivered to the interdigitated structure to achieve a pulser functionality.

FIG. 4 is a schematic representation which illustrates the operation of the arrangement of FIG. 2 in a system context. A frequency controller 50 issues a pulse train $f_1$ at a pulse output thereof which is subjected to an optical delay 52, illustratively in the form of a prism. The frequency controller additionally produces at a further pulse output a sequence of pulses at a frequency $f_2$. Both outputs, $f_1$ and $f_2$, control respective optical choppers 54 and 55. The outputs of the optical choppers are combined in a splitter/combiner 57, and the combined outputs having components $f_1$ and $f_2$ is connected to lens 19 via an optical fiber 60. The combined optical signals are directed to photoresponsive gate 12, which as previously indicated, is arranged electrically intermediate of electrode 13 and electrode 11 on which the probe tip (not shown in this figure) is disposed.

Frequency controller 50 produces at an output 61 a signal which is responsive to the difference between the frequencies $f_2$ and $f_1$. This signal is conducted to a lock-in amplifier 65 which in tuned to amplify only in a narrow frequency band in the vicinity of $f_2 - f_1$.

Lock-in amplifier 65 produces an output signal which is directed to a display system 67. The display system therefore provides a visual indication which is indicative of the response of a device under test when it is subjected to a pulser train of optical pulses chopped at a frequency $f_1$ combined with a gate train of optical pulses chopped at $f_2$.

Figure 5:
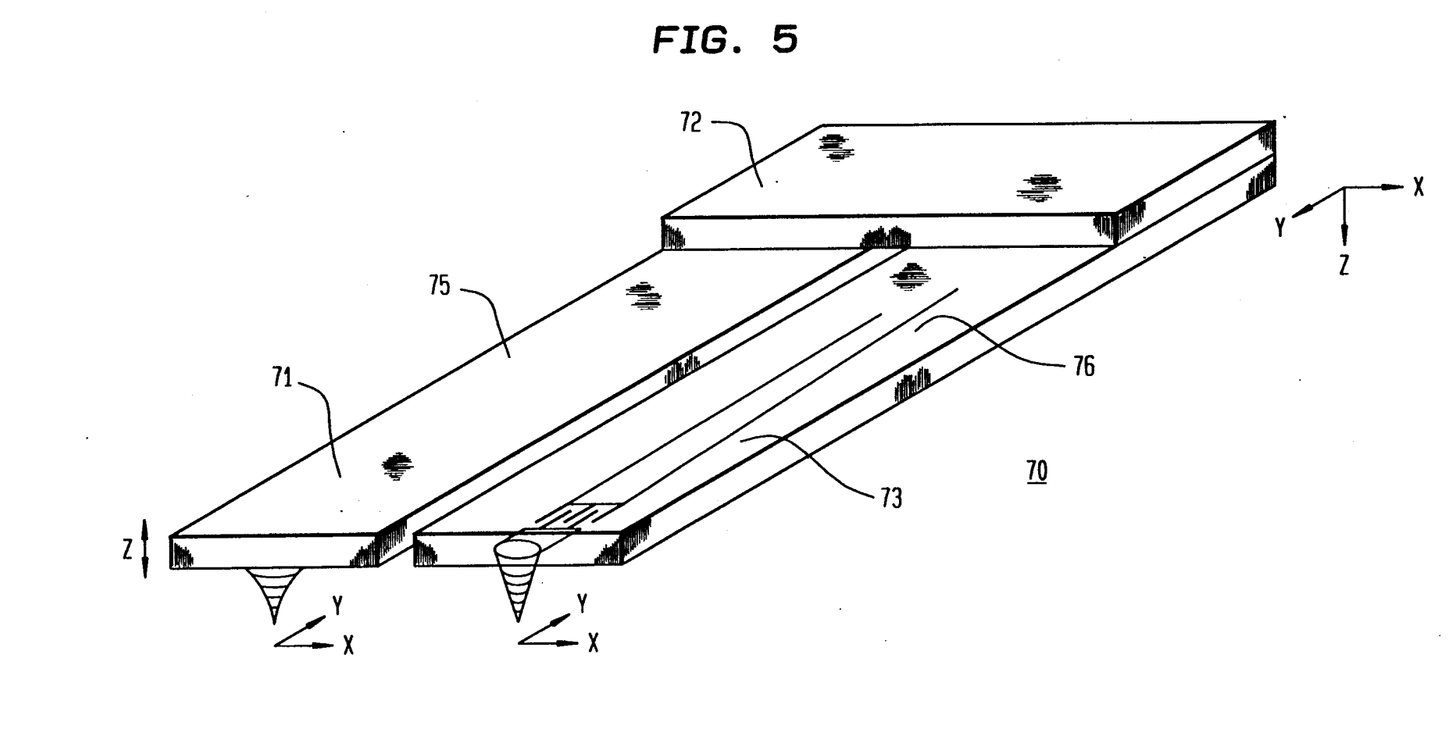
FIG. 5 is a schematic representation which illustrates the manner in which the probe system can be precisely referenced to a submicrometer scanning imaging arrangement using piezoelectric material to effect translation.

FIG. 5 is a schematic representation which illustrates the manner in which piezoelectric bimorphous materials can be employed to cause movement in the z-direction. FIG. 5 shows an arrangement 70 wherein a microscope 71, which may be a scanning tunneling microscope or an atomic force microscope is installed on a common support 72 with a photoconductive probe 73, constructed as discussed hereinabove. Microscope 71 and probe 73 are each installed on respective piezoelectric elements 75 and 76 which facilitate independent translation with respect to one another in the z-direction.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A probe for achieving high-impedance electrical communication with a device under test which is to be subjected to measurement of high-speed electrical signals, the probe comprising:

contact electrode means for contacting electrically the device under test;

input/output electrode means for selectably receiving and producing the high-speed electrical signals; and photoconductive gate means coupled between said input/output electrode means and said contact electrode means for controlling electrical communication between said input/output electrode means and said contact electrode means in response to an optical signal, said photoconductive gate means being formed as a metal-semiconductor-metal interdigitated electrode on a gate layer of a high-resistivity semiconductor material having a carrier lifetime of less than approximately 10 ps and a bandgap sufficiently narrow to effect absorption from an optical gate pulse having a duration of less than approximately 10 ps thereby resulting in photoconductivity, said interdigitated electrodes having spacings and widths on the order of 1 μm.

2. The probe of claim 1 wherein said contact electrode means is dimensioned to have a height less than approximately 0.1 mm.

3. The probe of claim 1 wherein said contact electrode means is formed integrally with said photoconductive gate means.

4. The probe of claim 1 wherein said contact means is movable with respect to the device under test, for contacting electrically selectable portions thereof.

5. The probe of claim 1 wherein said contact electrode means comprises probe tip means formed of an electrically conductive material and arranged to protrude so as to facilitate making the electrical contact with the device under test.

6. The probe of claim 5 wherein said probe tip means is configured to have a substantially conical shape, having a height of approximately 3.5 μm and a tip radius of less than approximately 1 μm.

7. The probe of claim 1 wherein there is further provided:

a transparent layer formed of a semiconductor material for receiving an optical signal, said transparent layer having a band-gap characteristic sufficiently wide to be transparent to said optical signal; and gate layer is arranged intermediate of said probe tip means and said transparent layer, said gate layer being formed of a semiconductor material characterized by high electron mobility and having a thickness of approximately between 0.5 and 1.5 μm, said gate layer having a band-gap characteristic sufficiently narrow to effect absorption of said optical signal and produce photoconductivity.

8. The probe of claim 7 wherein said transparent layer is formed of AlGaAs and said gate layer is formed of low-temperature grown GaAs.

9. The probe of claim 7 wherein said transparent layer is formed of InP or GaAs and said gate layer is formed of low-temperature grown GaAs.

10. The probe of claim 7 wherein said transparent layer is formed of sapphire and said gate layer is formed of ion-implanted Si.

11. The probe of claim 7 wherein said transparent layer is formed of glass, sapphire, or other transparent material and said gate layer is formed of polycrystalline-form GaAs, InGaAs, Si or Ge.

12. The probe of claim 7 wherein said transparent layer is formed of AlGaAs.

13. The probe of claim 7 wherein there is further provided a deposited transparent layer for strengthening the probe.

14. The probe of claim 14 wherein said layer of strengthening material is formed of $Al_2O_3$.

15. The probe of claim 1 wherein said input/output electrode means is provided with a shielding system for reducing electrical interference.

16. The probe of claim 15 wherein said shielding system comprises:

an undercoating layer arranged on a first side of said input/output electrode;

an overcoating layer arranged on a second side of said input/output electrode; and a metal layer arranged on said overcoating layer for forming an electrical shield.

17. The probe of claim 16 wherein said undercoating and overcoating layers are formed of $Al_2O_3$.

18. The probe of claim 15 wherein said input/output electrode means comprises the center conductor of a coaxial cable.

19. The probe of claim 1 wherein there is further provided integrated low-pass filter means for coupling said contact electrode to a reference electrode.

20. The probe of claim 1 wherein said interdigitated electrodes have an interdigit spacing of less than approximately 1 μm.

21. The probe of claim 1 wherein there is further provided capacitor means coupled to said input/output electrode means for storing an electrical charge.

22. The probe of claim 21 wherein said capacitor means is formed integrated with said input/output electrode means.

23. The probe of claim 1 wherein there is further provided band-pass filter means coupled to said input/output electrode means.

24. A probe system for achieving high frequency electrical communication with a device under test, the probe system comprising:

probe tip means for contacting electrically the device under test, said probe tip means having a tip radius of less than 1 μm;

terminal means for communicating electrically with said probe tip means; and photoresponsive gate means formed of submicron gate elements, said photoresponsive gate means being interposed between said probe tip means and said terminal means for controlling electrical conduction between said probe tip means and said terminal means in response to an optical signal, said photoresponsive gate means being formed of a plurality of interdigitated gate electrode elements arranged approximately between 1 μm and 2 μm of one another.

25. The probe system of claim 24 wherein said probe tip means is dimensioned to have a height of approximately 3.5 μm.

26. The probe system of claim 24 wherein said probe tip means is formed of deposited metal.

27. The probe system of claim 26 wherein said photoresponsive gate means is formed on a layer of semiconductor material characterized by an electron mobility characteristic on the order of 100 $cm^2$/Vs or greater.

28. A pulser/sampler probe system for delivering an electrical pulse having high frequency energy content to a device under test and receiving electrical energy from the device under test, the pulser/sampler probe system comprising:

probe tip means for contacting electrically the device under test, said probe tip means having a submicron tip radius;

probe tip electrode means for communicating electrically with said probe tip means;

input electrode means for receiving an input electrical signal;

input photoresponsive gate means formed of submicron gate elements and interposed between said probe tip electrode means and said input electrode means for controlling electrical conduction therebetween in response to a first optical signal;

output electrode means for receiving an output electrical signal from said probe tip electrode means; and output photoresponsive gate means formed of submicron gate elements and interposed between said probe tip electrode means and said output electrode means for controlling electrical conduction therebetween in response to a second optical signal.

29. The pulser/sampler probe system of claim 28 wherein said first optical signal is characterized by a first frequency ($f_1$) and said second optical signal is characterized by a second frequency ($f_2$), there being further provided lock-in amplifier means responsive to signals characterized by a frequency which corresponds to the difference between the first and second frequencies ($f_2-f_1$).

30. The pulser/sampler probe system of claim 28 wherein there is further provided capacitor means coupled to said input electrode means for storing a charge to be switched by said input photoresponsive gate means.

31. The pulser/sampler probe system of claim 28 wherein there is further provided termination electrode means coupled to said probe tip electrode means for providing a predetermined impedance at said probe tip means.

* * * * *